United States Patent
Hong

(10) Patent No.: US 9,463,975 B2
(45) Date of Patent: Oct. 11, 2016

(54) MEMS CAPACITIVE PRESSURE SENSORS

(71) Applicant: Semiconductor Manufacturing International (Shanghai) Corporation, Shanghai (CN)

(72) Inventor: Zhongshan Hong, Shanghai (CN)

(73) Assignee: SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 0 days.

(21) Appl. No.: 14/684,832

(22) Filed: Apr. 13, 2015

(65) Prior Publication Data

US 2015/0210536 A1 Jul. 30, 2015

Related U.S. Application Data

(62) Division of application No. 14/095,155, filed on Dec. 3, 2013, now Pat. No. 9,029,212.

(30) Foreign Application Priority Data

Jul. 3, 2013 (CN) .......................... 2013 1 0277644

(51) Int. Cl.
  *B81B 7/00* (2006.01)
  *B81B 3/00* (2006.01)
  *B81C 1/00* (2006.01)
  *G01L 9/00* (2006.01)

(52) U.S. Cl.
  CPC ............. *B81B 7/007* (2013.01); *B81B 3/0021* (2013.01); *B81C 1/00166* (2013.01); *B81C 1/00182* (2013.01); *G01L 9/0073* (2013.01); *B81B 2201/0264* (2013.01); *B81B 2203/0392* (2013.01); *B81B 2203/04* (2013.01)

(58) Field of Classification Search
  None
  See application file for complete search history.

(56) References Cited

U.S. PATENT DOCUMENTS

| | | | |
|---|---|---|---|
| 7,405,099 B2 | 7/2008 | Gogoi | |
| 7,666,798 B2 | 2/2010 | Bryant et al. | |
| 2006/0081052 A1 | 4/2006 | Silverbrook et al. | |
| 2006/0081057 A1 | 4/2006 | Silverbrook et al. | |
| 2006/0108652 A1 | 5/2006 | Partridge et al. | |
| 2010/0061143 A1 | 3/2010 | Carley | |
| 2010/0109102 A1* | 5/2010 | Chen | B81C 1/00238 257/417 |
| 2010/0170324 A1* | 7/2010 | Mastromatteo | G01G 3/13 73/24.06 |
| 2011/0179861 A1* | 7/2011 | Grange | B82Y 15/00 73/335.04 |
| 2012/0262026 A1 | 10/2012 | Lin et al. | |
| 2013/0139587 A1* | 6/2013 | Le Neel | G01N 27/223 73/335.04 |

* cited by examiner

*Primary Examiner* — Bilkis Jahan
(74) *Attorney, Agent, or Firm* — Anova Law Group, PLLC

(57) ABSTRACT

A MEMS capacitive pressure sensor is provided. The pressure sensor includes a substrate having a first region and a second region, and a first dielectric layer formed on the substrate. The pressure sensor also includes a first electrode layer formed on the first dielectric layer, and a second dielectric layer having first openings formed on the first electrode layer. Further, the pressure sensor includes conductive sidewalls connecting with the first electrode layer formed on sidewalls of the first openings, and a second electrode layer with a portion formed on the second dielectric layer in the second region and the rest suspended over the conductive sidewalls in the first region. Further, the pressure sensor also includes a chamber between the conductive sidewalls and the second electrode layer; and a third dielectric layer formed on the second electrode layer exposing a portion of the second electrode layer in the first region.

11 Claims, 7 Drawing Sheets

MEMS CAPACITIVE PRESSURE SENSORS

CROSS-REFERENCES TO RELATED APPLICATIONS

This application is a divisional of U.S. patent application Ser. No. 14/095,155, filed on Dec. 3, 2013 which claims priority to Chinese Patent application No. 201310277644.0, filed on Jul. 3, 2013, all of which are incorporated herein by reference in their entirety.

FIELD OF THE INVENTION

The present invention generally relates to the field of semiconductor manufacturing technology and, more particularly, relates to pressure sensors and fabrication techniques thereof.

BACKGROUND

Micro-electro-mechanical system (MEMS) is an integrated device which can obtain information; perform information processing; and execute operations. A MEMS sensor can detect various external information including pressure, position, velocity, acceleration, magnetic field, temperature or humidity, etc; and convert these external information into electrical signals. Thus, these external information can be processed by the MEMS. A pressure sensor is a device that can convert pressure signals into electric signals; and a MEMS capacitive sensor is a typical type of pressure sensors.

FIG. 1 illustrates an existing MEMS capacitive pressure sensor. As shown in FIG. 1, the MEMS capacitive pressure sensor includes a substrate 100. The substrate 100 may include a semiconductor substrate (not shown), a plurality of semiconductor devices (not shown), such as CMOS devices, etc., on the semiconductor substrate, electrical interconnection structures electrically connecting the semiconductor devices, and a dielectric layer isolating the semiconductor devices and the interconnection structures. The MEMS capacitive pressure sensor also includes a first electrode layer 101 on the substrate 100. The first electrode layer 101 is electrically connected with the semiconductor devices in the substrate 100 through the electrical interconnection structures. Further, the MEMS capacitive pressure sensor includes a second electrode layer 102 on the substrate 100; and a chamber 103 is formed between the first electrode layer 101 and the second electrode layer 102. The chamber 103 electrically isolates the first electrode layer 101 and the second electrode layer 102. Further, the MEMS capacitive pressure sensor also includes a dielectric layer 104 on a surface of the second electrode layer 103 and a surface of the substrate 100. A portion of the second electrode layer 102 is exposed by the dielectric layer 104.

The first electrode layer 101, the second electrode layer 102 and the chamber 103 form a capacitive structure. When the second electrode layer 102 is pressed by an external pressure, the second electrode layer 102 is deformed; and the distance between the first electrode layer 101 and the second electrode layer 102 is changed. Thus, the capacitance of the capacitive structure changes. Because the pressure on the second electrode layer 102 is corresponding to the capacitance of the capacitive structure, the pressure on the second electrode layer 102 can be converted into an output signal of the capacitive structure.

However, the sensibility of the capacitive structure may have a certain limitation, and may be unable to match requirements of continuous technology developments. The disclosed device structures, methods and systems are directed to solve one or more problems set forth above and other problems.

BRIEF SUMMARY OF THE DISCLOSURE

One aspect of the present disclosure includes a MEMS capacitive pressure sensor. The MEMS capacitive pressure sensor includes a substrate having a first region and a second region, and a first dielectric layer formed on the substrate. The MEMS capacitive pressure sensor also includes a first electrode layer formed on the first dielectric layer, and a second dielectric layer having a plurality of first openings formed on the first electrode layer. Further, the MEMS capacitive pressure sensor includes a plurality of conductive sidewalls connecting with the first electrode layer formed on sidewalls of the first openings, and a second electrode layer with a portion formed on the second dielectric layer in the second region and the rest suspended over the conductive sidewalls in the first region. Further, the MEMS capacitive pressure sensor also includes a chamber between the conductive sidewalls and the second electrode layer, and a third dielectric layer on the second electrode layer exposing a portion of the second electrode layer in the first region.

Another aspect of the present disclosure includes a method for fabricating a MEMS capacitive pressure sensor. The method includes providing a substrate having a first region and a second region; and forming a first dielectric layer on the substrate. The method also includes forming a first electrode layer on the first dielectric layer; and forming a second dielectric layer on the first electrode layer. Further, the method includes etching the second dielectric layer until the first electrode layer is exposed to form a plurality of first openings; and forming a plurality of conductive sidewalls connecting with the first electrode layer on sidewalls of the first openings. Further, the method also includes forming a sacrificial layer on a surface of the second dielectric layer in the second region, surfaces of the conductive sidewalls and surfaces of the bottoms of the first openings; and forming a second electrode layer with a plurality of third openings exposing a portion of the sacrificial layer on the sacrificial layer. Further, the method also includes removing the sacrificial layer to formed a chamber between the conductive sidewalls and the second electrode layer; and forming a third dielectric layer with a second opening exposing the surface of a portion of the second electrode layer in the first region on the second electrode layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
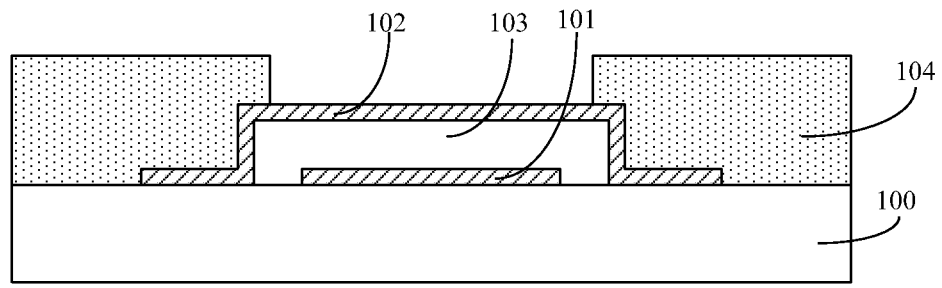
FIG. 1 illustrates an existing MEMS capacitive pressure sensor.

Referring to FIG. 1, when the MEMS capacitive pressure sensor converts the pressure applied on the second electrode layer 102 into an electrical output signal of the capacitive structure, the capacitance of the capacitive structure is reversely proportional to the distance between the first electrode layer 101 and the second electrode layer 102. The capacitance of the capacitive structure is also proportional to an overlap area of the first electrode layer 101 and the second electrode layer 102.

However, size of such a MEMS capacitive pressure sensor may be limited by a chip size and/or sizes of semiconductor devices; and the overlap area between the first electrode layer 101 and the second electrode layer 102 may also be limited, which may cause the capacitance between the first electrode layer 101 and the second electrode layer 102 to be relatively small. When the applied pressure is substantially small, a corresponding capacitance change between the first electrode layer 101 and the second electrode layer 102 may be also substantially small, thus it may be difficult to obtain the corresponding capacitance. Therefore, the sensitivity of such a MEMS capacitive pressure sensor may be relatively low. MEMS structures using three dimensional (3-D) electrode layers are disclosed to overcome these issues.

Figure 14:
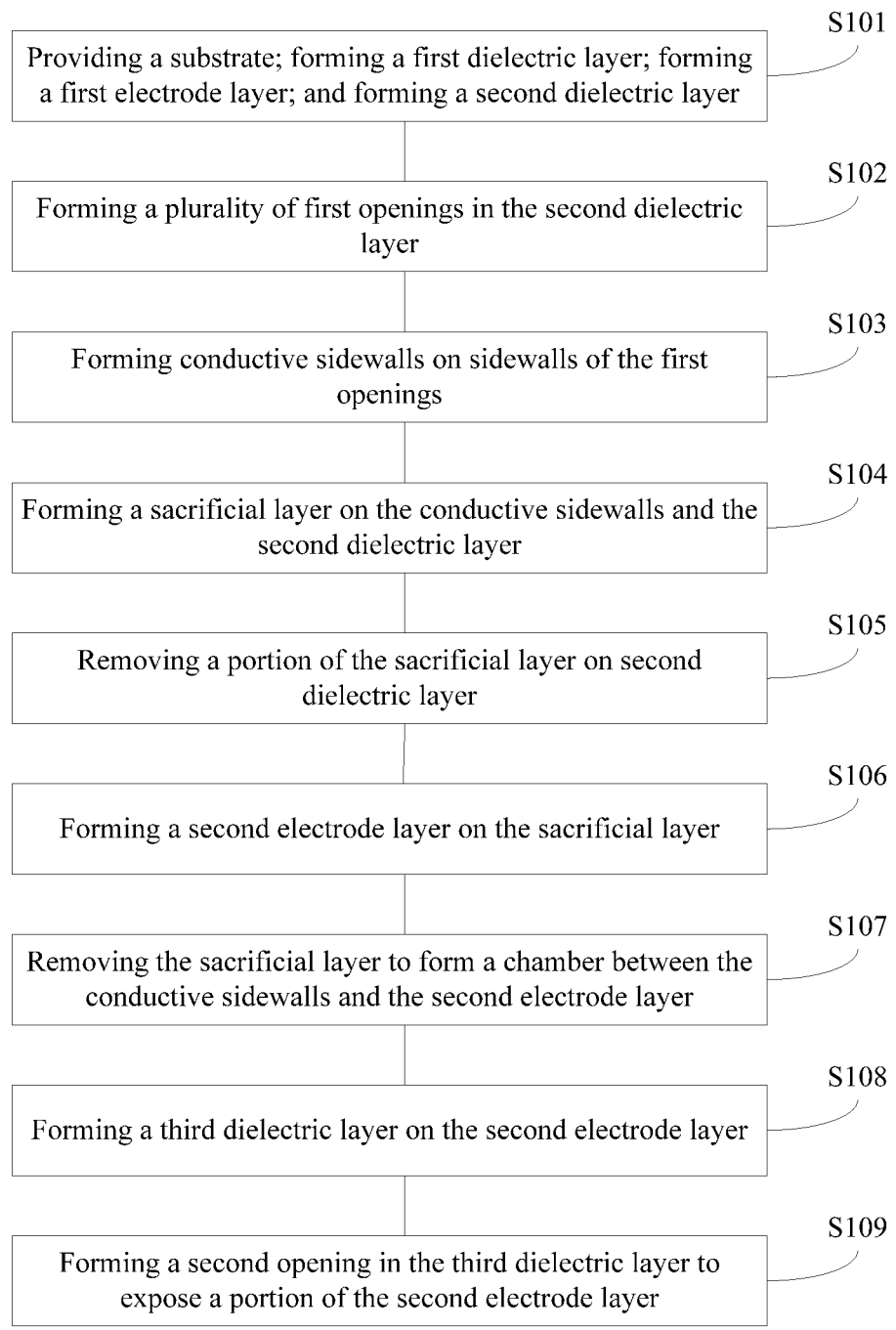
FIG. 14 illustrates an exemplary fabrication process of a MEMS capacitive pressure sensor consistent with the disclosed embodiments.

FIG. 14 illustrates an exemplary fabrication process of a MEMS capacitive pressure sensor; and FIGS. 2~13 illustrate exemplary semiconductor structures corresponding to various stages of the fabrication process.

Figure 2:
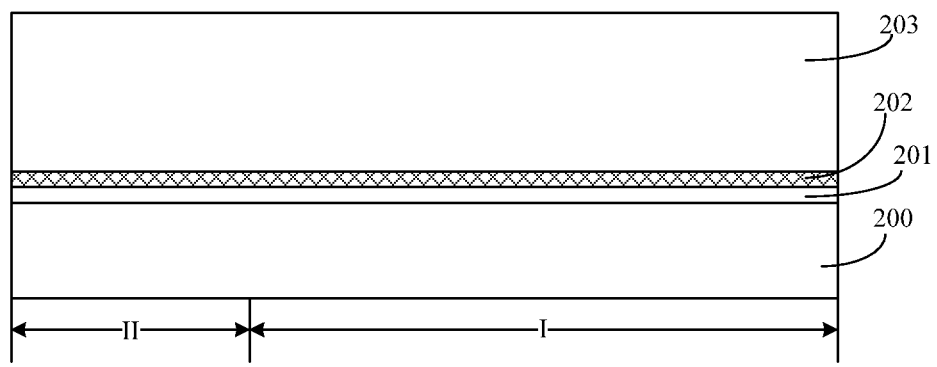
FIGS. 2-13 illustrate semiconductor structures corresponding to certain stages of an exemplary fabrication process of a MEMS capacitive pressure sensor consistent with the disclosed embodiments.

As shown in FIG. 14, at the beginning of the fabrication process, a substrate with certain structures is provided (S101). FIG. 2 illustrates a corresponding semiconductor structure.

As shown in FIG. 2, a substrate 200 is provided. The substrate 200 may have a device region I and a peripheral region II. The peripheral region II may surround the device region I. For illustrative purposes, only a portion of the device region I and a portion of the peripheral region II at one side of the device region I is shown in FIG. 2.

The substrate 200 may include a semiconductor substrate (not shown) and a plurality of the semiconductor devices (not shown) formed in the semiconductor substrate, and/or on one surface of the semiconductor substrate. The semiconductor devices may be CMOS devices including transistors, memories, capacitors or resistors, etc. Other devices may also be included. The substrate 200 may also include electrical interconnection structures (not shown) and a dielectric layer (not shown) isolating the semiconductor devices. Some devices/structures may be added in the substrate 200; and some devices/structures may be omitted.

The semiconductor substrate may include any appropriate semiconductor materials, such as silicon, silicon on insulator (SOI), silicon germanium, carborundum, indium antimonide, lead telluride, indium arsenide, indium phosphide, gallium arsenidie, gallium antimonite, ally semiconductor or a combination thereof. The semiconductor substrate may also be germanium on insulator (GOI), or glass substrate, etc.

In certain other embodiments, the substrate 200 may be just a semiconductor substrate without any semiconductor device. The semiconductor substrate may include silicon, silicon on insulator (SOI), germanium on insulator (GOI), silicon germanium, carborundum, indium antimonite, lead telluride, indium arsenide, indium phosphide, gallium arsenidie, gallium antimonite or alloy semiconductor, etc.

The dielectric layer may be made of any appropriate material, such as one or more of silicon oxide, silicon nitride and silicon oxynitride, etc.

In one embodiment, the semiconductor devices are CMOS transistors; and the semiconductor substrate is silicon. A MEMS capacitive pressure sensor may be subsequently formed in the device region I.

Further, as shown in FIG. 2, a first dielectric layer 201 (may be referred as a first insulator) may be formed on one surface of the substrate 200. The first dielectric layer 201 may be formed on the dielectric layer for isolating semiconductor devices and the electrically interconnection structures in the substrate 200. Thus, the first dielectric layer 201 may be used to isolate a subsequently formed first electrode layer form the substrate 200.

The first dielectric layer 201 may be made of any appropriate material, such as silicon oxide, silicon nitride or silicon oxynitride, etc. The first dielectric layer 201 may also be made of low dielectric constant material with a dielectric constant smaller than 3.9. A thickness of the first dielectric layer 201 may be in a range of approximately 100 Å~1000 Å. Various processes may be used to form the first dielectric layer 201, such as a chemical vapor deposition (CVD) process, a physical vapor deposition (PVD) process, an atomic layer deposition (ALD) process, a selective epitaxial process or a flowable chemical vapor deposition (FCVD) process, etc. In one embodiment, the first dielectric layer 201 is formed by a CVD process.

In one embodiment, conductive vias may be formed in the first dielectric layer 201, and/or in the substrate 200. The conductive vias may be used to electrically connect a subsequently formed first electrode layer with the semiconductor devices in, and/or on the substrate 200.

In certain other embodiments, when the substrate 200 is just a semiconductor substrate without any devices and structures, the first dielectric layer 201 may be directly formed on the semiconductor substrate.

The first dielectric layer 201 may be used to isolate a subsequently formed first electrode layer from the substrate 200. The first dielectric layer 201 may also be used as an etching stop layer to protect the surface of the substrate 200 when subsequent etching processes are performed.

Further, as shown in FIG. 2, after forming the first dielectric layer 201, a first electrode layer 202 (may be referred as a first metal layer) may be formed on the first dielectric layer 201. The first electrode layer 202 may electrically connect with subsequently formed conductive sidewalls; and cause the conductive sidewalls to be an electrode of a capacitive structure. The first electrode layer 202 may also connect with the semiconductor devices and/or electrical interconnection structures in the substrate 200 through the conductive vias formed in the first dielectric layer 201.

The first electrode layer 202 may be made of any appropriate material, such as one or more of TiN, Ti, TaN, Ta, W, TiC, and La, etc. A thickness of the first electrode layer 202 may be in a range of approximately 100 Å~5000 Å. Various processes may be used to form the first electrode layer 202, such as a PVD process, a CVD process, an ALD process or an electroplating process including a direct electroplating process or a chemical electroplating process, etc.

Further, as shown in FIG. 2, after forming the first electrode layer 202, a second dielectric layer 203 (may be referred as a second insulator) may be formed on the first electrode layer 202. The second dielectric layer 203 may be used to define a depth of subsequently formed first openings. A thickness of the second dielectric layer 203 may be in a range of approximately 2000 Å~50000 Å. The depth of the subsequently formed first openings may be equal to the thickness of the second dielectric layer 203.

The second dielectric layer 203 may be made of any appropriate material, such as silicon oxide, silicon nitride or silicon oxynitride, etc. The second dielectric layer 203 may also be made of low dielectric constant material with a dielectric constant smaller than 3.9. Various processes may be used to form the second dielectric layer 203, such as a CVD process, a PVD process, an ALD process, a selective epitaxial process or a flowable chemical vapor deposition (FCVD) process, etc. In one embodiment, the second dielectric layer 203 is formed by a CVD process.

Figure 3:
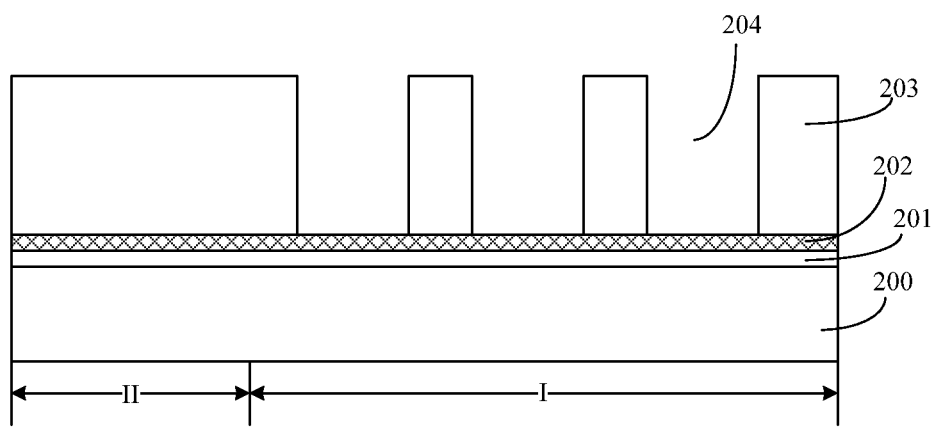
Figure 4:
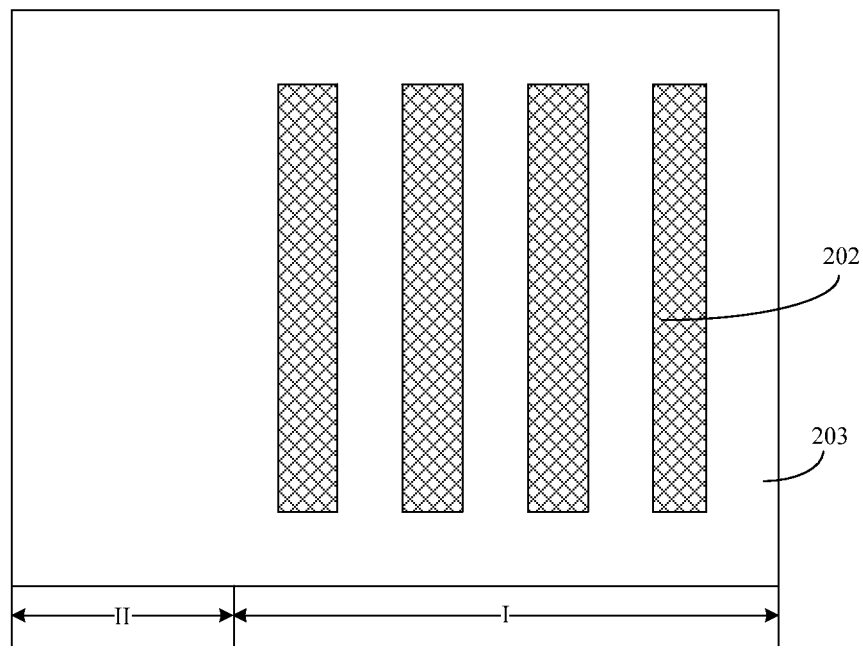

Returning to FIG. 14, after forming the second dielectric layer 203, a plurality of first openings may be formed in the second dielectric layer 203 in the device region I (S102). FIG. 3 illustrates a corresponding semiconductor structure; and FIG. 4 illustrates a top view of the semiconductor structure illustrated in FIG. 3.

As shown in FIG. 3, a plurality of first openings 204 are formed in the second dielectric layer 203. The first openings 204 may be formed by etching the second dielectric layer 203 until the first electrode layer 202 is exposed. That is, the first openings 204 may be embedded in the second dielectric layer 203. The first openings 204 may be used to subsequently form conductive sidewalls. A total number of the first openings 204 may be equal to, or greater than one.

A process for forming the first opening 204 may include forming a photoresist layer exposing corresponding positions of the first openings 204 on one surface of the second dielectric layer 203, followed by etching the second dielectric layer 203 until the first electrode layer 203 is exposed. Various processes may be used to etch the second dielectric layer 203, such as a wet etching process, or a dry etching process, etc.

In one embodiment, an anisotropic dry etching process is used to etch the second dielectric layer 203. The anisotropic dry etching process may be a plasma etching process. The first openings 204 formed by the anisotropic dry etching process may have vertical sidewalls. That is, sidewall surfaces of the first openings 204 may be vertical to the surface of the substrate 200.

Detailed parameters of the anisotropic dry etching process may depend upon the material and the thickness of the second dielectric layer 203 and a width of the first openings 204. In one embodiment, the depth of the first openings 204 may be equal to the thickness of the second dielectric layer 203. The width of the first openings 204 may be in a range of approximately 3000 Å~10 μm. Such a width may ensure that the first openings 204 are unable to be filled up after subsequently forming a sacrificial layer in the first openings 204, and/or forming a second electrode layer. Thus, the second electrode layer may extend into the first openings 204; and an overlap area of the second electrode layer and subsequently formed conductive sidewalls may be increased.

A projection of the first openings 204 on the surface of the second dielectric layer 203 may be any appropriate shapes, such as stripes, circles, squares or polygons. etc. A number of the first openings 204 may be greater than two. A distance between adjacent two first openings 204 may be in a range of approximately 3000 Å~1 μm. The distance between two adjacent first openings 204 may be equal to a width of the first openings 204. The distance between two adjacent first openings 204 may also be different from a width of the first openings 204. In one embodiment, as shown in FIG. 4, the patterns of the first openings 204 on the surface of the second dielectric layer 202 may be four parallel strips.

When a projection of the first openings 204 on the surface of the second dielectric layer 203 are parallel strips, the area of subsequently formed conductive sidewalls may be significantly large, thus an overlap area of a subsequently formed second electrode layer between the conductive sidewalls may be significantly large; the capacitance of a subsequently formed capacitive structure may be significantly large as well. When a pressure is applied on the second electrode layer, a change of the capacitance of the capacitive structure may be increased, and the sensibility of the pressure sensor may be significantly improved. Further, because strips may be simple patterns, a process for forming the photoresist layer may be simple too; it may be easy to etch the second dielectric layer 203 to form the first openings 204 with the strip patterns.

Figure 12:
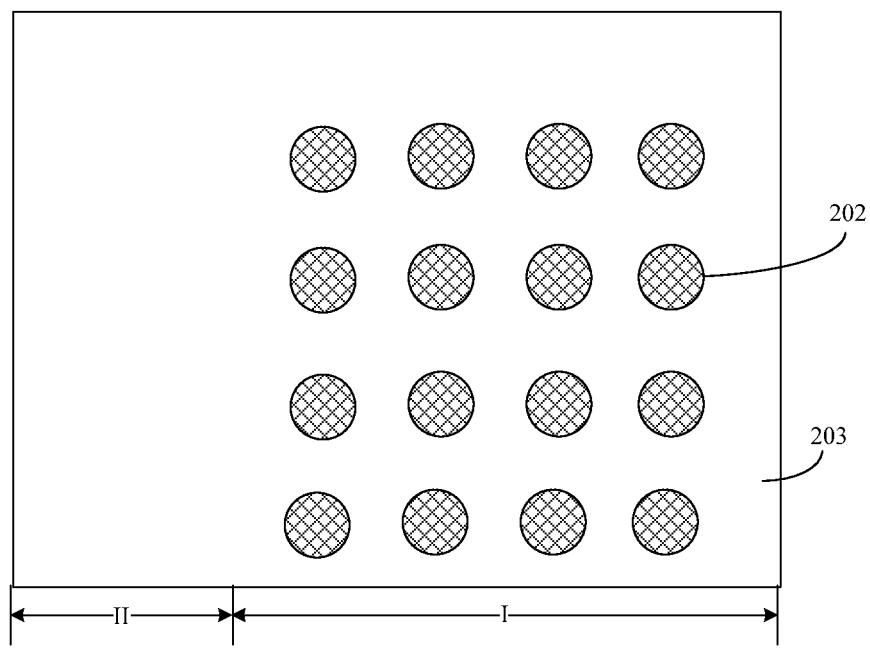
Figure 13:
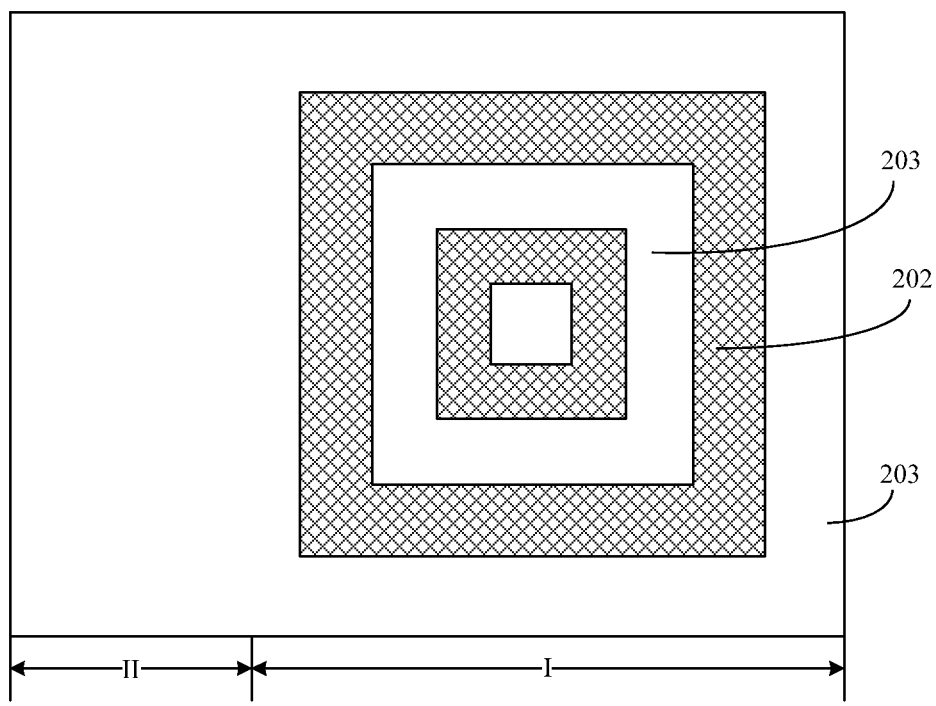

In certain other embodiments, the first openings 204 may be a plurality of through holes. The through holes may form an array. A projection of the through holes on the surface of the second dielectric layer 203 may be circles, squares or polygons. In one embodiment, as shown in FIG. 12, the projection of the through holes on the surface of the second dielectric layer 203 are circles In certain other embodiments, the projection of the first openings 204 on the surface of the second dielectric layer 203 may concentric circles, a subsequently formed second electrode layer extending into the first openings 204 may have concave depressions toward the first openings 204. Such depressions may cause the subsequently formed second electrode layer in the first openings 204 to have a more uniform pressure distribution; and the second electrode layer may have a significantly large deformation under the pressure. Thus, a capacitive structure having such a second conductive layer may have a significantly large capacitive change; and the sensibility of a pressure sensor with the capacitive structure may be further improved.

Figure 5:
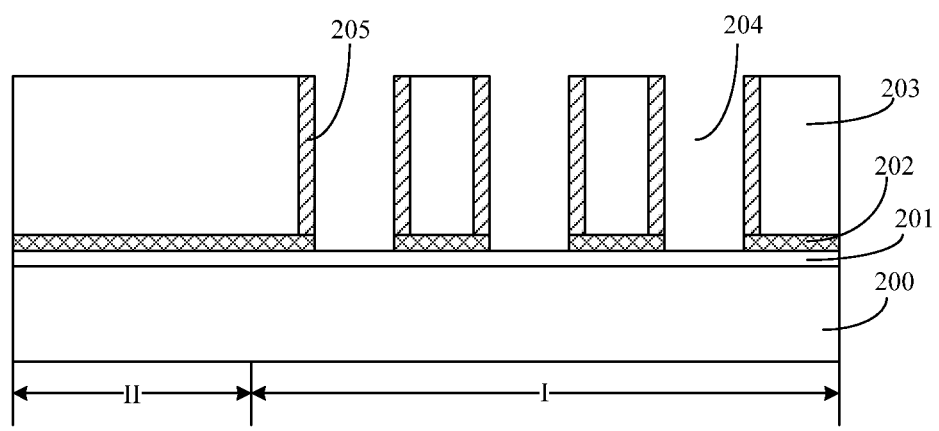

Returning to FIG. 14, after forming the first openings 204, conductive sidewalls may be formed on sidewalls of the first opening 204 (S103). FIG. 5 illustrates a corresponding semiconductor structure.

As shown in FIG. 5, conductive sidewalls 205 (may be referred as second metal spacer layers) are formed on sidewalls of the first openings 204. The conductive sidewalls 205 may connect with the first electrode layer 202.

A process for forming the conductive sidewalls 205 may include forming a conductive layer on the surface of the second dielectric layer 203, the sidewalls and bottoms of the first openings 204, followed by performing an etch back process to etch the conductive layer until bottoms of the first openings 204 and the surface of the second dielectric layer 203 are exposed.

The conductive sidewalls 205 (or the conductive thin film) may be made of any appropriate material, such as one or more of TiN, Ti, TaN, Ta, W, TiC, TaC and La, etc. A thickness of the conductive thin film may be in a range of approximately 100 Å~2000 Å.

Various processes may be used to form the conductive thin film, such as a CVD process, a PVD process, an FCVD process or an electroplating process, etc. In one embodiment, the conductive thin film is formed by a CVD process.

Various processes may be used to perform the etch back process onto the conductive thin film to form the conductive sidewalls 205, such as a dry etching process, a wet etching process, or an ion beam etching process, etc. After the etch back process, a thickness of the conductive sidewalls 205 may be still equal to the thickness of the conductive thin film.

The conductive sidewalls 205 may be able to connect with the first electrode layer 202, thus all the conductive sidewalls 205 on the sidewalls of the first openings 204 may be connected together. Further, first conductive vias may be subsequently formed on a surface of first electrode layer 202, and electrical interconnection structures connecting with the first conductive vias and the semiconductor devices in the substrate 200 may also be subsequently formed, thus the conductive sidewalls 205 may be electrically connected with the semiconductor devices and interconnection structures in the substrate 200.

Further, referring to FIG. 5, after forming the conductive sidewalls 205, a portion of the first electrode layer 202 on the bottoms of the first openings 204 may be removed. The portion of the first electrode layer 202 on the bottoms of the first openings 204 may be removed by any appropriate etching process using the conductive sidewalls 205 and the second dielectric layer 203 as an etching mask. The first dielectric layer 201 may be exposed by the first openings 204 after removing the portion of the first electrode layer 202.

A capacitive structure may be formed after subsequently forming a second electrode layer. The capacitive structure may include the conductive sidewalls 205, the second electrode layer and a chamber between the conductive sidewalls 205 and the second electrode layer. A capacitance of the capacitive structure may depend on an overlap area of the conductive sidewalls 205 and the second electrode layer. It may be easy to control the capacitance of the capacitive structure after removing the portion of the first electrode layer 202 on the bottoms of the first openings 204.

Further, a pressure applied on the subsequently formed second electrode layer may be often vertical to the surface of the substrate 200, if the pressure is significantly large, the portion of the first electrode layer 202 on the bottom of the first openings 204 may contact with the second electrode layer, and a short circuit may happen. Therefore, after removing the portion of the first electrode layer 202 on the bottoms of the first openings 204, the short circuit may be prevented, and a stability of a pressure sensor having the capacitive structure may be significantly enhanced.

In certain other embodiments, the portion of the first electrode layer 202 on the bottoms of the first openings 204 may be removed before forming the conductive sidewalls 205. Thus, the first openings 204 may expose the first dielectric layer 201. When the conductive thin film is formed on the sidewalls of the first openings 204, it may also be formed on the first dielectric layer 201 on the bottom of the first openings 204; and the conductive sidewalls 205 may electrically connect with the first electrode layer 202.

Figure 6:
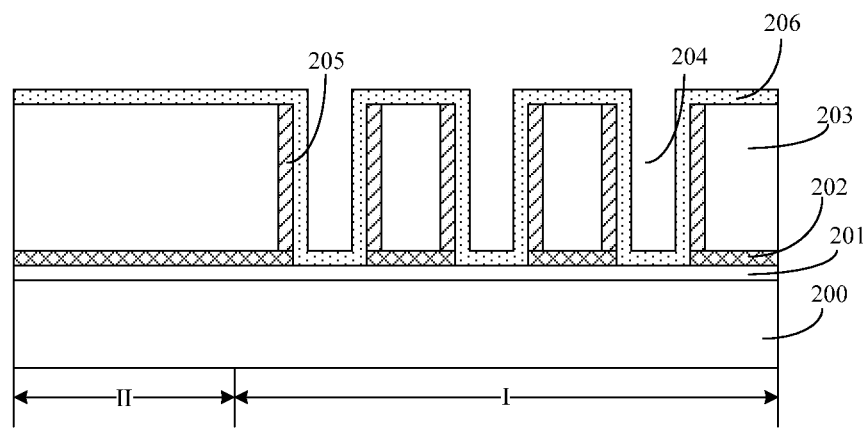

Returning to FIG. 14, after forming the conductive sidewalls 205, a sacrificial layer may be formed (S104). FIG. 6 illustrates a corresponding semiconductor structure.

As shown in FIG. 6, a sacrificial layer 206 is formed on the surfaces of the second dielectric layer 203, the conductive sidewalls 205 and the bottoms of the first openings 204. The sacrificial layer 206 may be used to define a position of a subsequently formed chamber. A thickness of the sacrificial layer 206 may be in a range of approximately 200 Å~3000 Å. The thickness of the sacrificial layer may be equal to a distance between a subsequently formed second electrode layer and the conductive sidewalls 205. That is, the distance between the subsequently formed second electrode layer and the conductive sidewalls 205 may also be in a range of approximately 200 Å~3000 Å.

The sacrificial layer 206 may be made of any appropriate material, such as carbon-based polymer, poly silicon, amorphous carbon, amorphous silicon or phosphor-silicate-glass (PSG), etc. In one embodiment, the sacrificial layer 206 is made of poly silicon.

Various processes may be used to form the sacrificial layer 206, such as a CVD process, a PVD process, an ALD process, an FCVD process or an epitaxial growth process, etc. In one embodiment, the sacrificial layer 206 is formed by a selective epitaxial growth process.

A temperature of the selective epitaxial growth process may be in a range of approximately 500° C.~800° C. A pressure of the selective epitaxial growth process may be in a range of approximately 1 Torr~100 Torr. A source gas of the selective epitaxial growth process may include a silicon source gas ($SiH_4$ or $SiH_2Cl_2$), HCl and $H_2$, etc. A flow of the silicon source gas may be in a range of approximately 1 sccm~1000 sccm. A flow of HCl may be in a range of approximately 1 sccm~1000 sccm. A flow of $H_2$ may be in a range of approximately 0.1 sccm~50 sccm.

Figure 7:
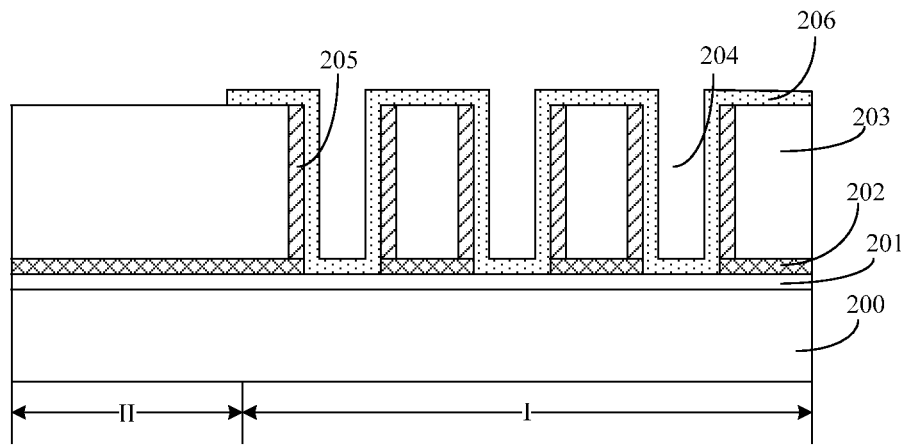

Returning to FIG. 14, after forming the sacrificial layer 206, a portion of the sacrificial layer 206 in the peripheral region II may be removed (S105). FIG. 7 illustrates a corresponding semiconductor structure.

As shown in FIG. 7, a portion of the sacrificial layer 206 in the peripheral region II is removed, thus a portion of the surface of the second dielectric layer 203 may be exposed. A portion of a subsequently formed second electrode layer may be formed on the exposed portion of the second dielectric layer 203. The portion of the second electrode layer on the exposed portion of the second dielectric layer 203 may be used to support the rest of the second electrode layer to be suspended over the conductive sidewalls 205 and the bottoms of the first openings 204. An area of the portion of the second electrode layer on the exposed portion of the second dielectric layer 203 may only need to be strong enough to support the rest of the second electrode to be suspended over the conductive sidewalls 205 and the bottoms of the first openings 204. Thus, an area of the second electrode layer may be reduced. Further, the structure of a capacitive structure having such a second electrode layer, the conductive sidewalls 205, a subsequently formed chamber may be relatively stable. Thus, a pressure sensor having such capacitive structure may have a desired performance.

A process for removing the portion of the sacrificial layer 206 in the peripheral region II may include forming a photoresist layer exposing the sacrificial layer 206 in the peripheral region II on the sacrificial layer 206; followed by etching the sacrificial layer 206 until the surface of the second dielectric layer 203 is exposed.

Various processes may be used to etch the sacrificial layer 206, such as a dry etching process, a wet etching process, or an ion beam etching process, etc. In one embodiment, the sacrificial layer 206 is etched by an anisotropic dry etching process.

Figure 8:
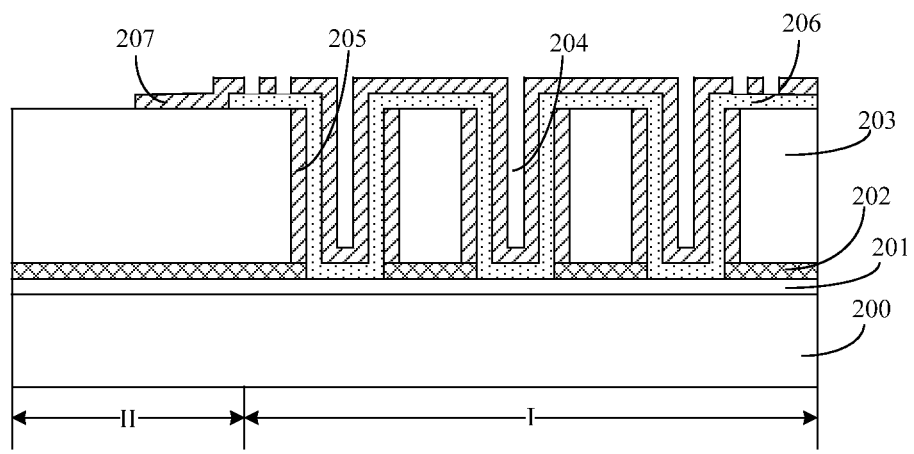

Returning to FIG. 14, after removing the portion of the sacrificial layer 206 in the peripheral region II, a second electrode layer may be formed on the sacrificial layer 206 (S106). FIG. 8 illustrates a corresponding semiconductor structure.

As shown in FIG. 8, a second electrode layer 207 (may be referred as a third metal layer) is formed on the exposed surface of the second dielectric layer in the peripheral region II, and surfaces of sidewalls and top of the sacrificial layer 206. A portion of the sacrificial layer 206 may be exposed by the second electrode layer 207. The second electrode layer 207 may follow shapes of the first openings 204. A thickness of the second electrode layer may be in a range of approximately 100 Å~2000 Å.

A process for forming the second electrode layer 207 may include forming a second electrode thin film on the second dielectric layer 203 in the peripheral region II, and the sidewalls and the top surface of the sacrificial layer 206, followed by etching the second electrode thin film until the surface of sacrificial layer 206 is exposed. Thus, the second electrode layer 207 is formed.

The second electrode layer 207 may be made of any appropriate material, such as one or more of TiN, Ti, TaN, Ta, W, TiN, TaC and La, etc. Various processes may be used to form the second electrode layer 207, such as a CVD process, a PVD process, an ALD process, an FCVD process or an electroplating process, etc.

In one embodiment, the portion of sacrificial layer 206 may be exposed by a plurality of third openings (not labeled) in the second electrode layer 207 in the peripheral region II. The third openings may be used as paths to subsequently remove the sacrificial layer 206 using an etching process. An etchant of the etching process may start to etch the sacrificial layer 206 from the third openings to remove the sacrificial layer 206.

In certain other embodiments, a plurality of third openings may also be formed in the second electrode layer 206 in the device region I. The third openings may also expose a portion of the sacrificial layer 206. When a subsequent etching process is used to remove the sacrificial layer 206, an etching rate may be increased.

Referring to FIG. 6, in certain other embodiments, after forming the sacrificial layer 206 in the device region I and the peripheral region II, the sacrificial layer 206 in the peripheral region may be kept, and the second electrode layer 207 may be formed on the sacrificial layer 206. After subsequently removing the sacrificial layer 206 in the device region I, the sacrificial layer 206 in the peripheral region II may still be kept. The sacrificial layer 206 in the peripheral region II may be used to support the second electrode layer 207 to be suspended over the surfaces of the conductive sidewalls 205 and the bottoms of the first openings 204. Because it may unnecessarily need to remove the sacrificial layer 206 in the peripheral region II, fabrication process may be simplified.

Figure 9:
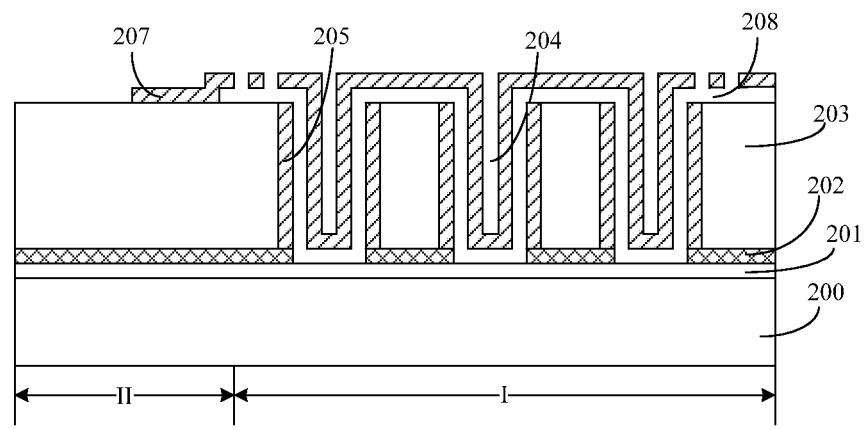

Returning to FIG. 14, after forming the second electrode layer 207, the sacrificial layer 206 may be removed; and a chamber may be formed (S107). FIG. 9 illustrates a corresponding semiconductor structure.

As shown in FIG. 9, the sacrificial layer between the first electrode layer 202 and the second electrode layer 207 is removed; and a chamber 208 is formed between the second electrode layer 207 and the surface of the second dielectric layer 203, the surface of the conductive sidewalls 205 and the surface of the bottom of the first openings 204.

After forming the chamber 208, a capacitive structure may be formed by the conductive sidewalls 205, the second electrode layer 207 and the chamber 208. When the second electrode layer 207 is deformed by an external pressure, a distance between the conductive sidewalls 205 and the second electrode layer 207 may be decreased; and a capacitance of the capacitive structure may be changed. A capacitance change of the capacitive structure may be used to obtain a value of the external pressure, thus a pressure sensor having the capacitive structure may be able to obtain the external pressure information. That is, a basic component of a MEMS capacitive pressure sensor is formed.

Various processes may be used to remove the sacrificial layer 206, such as a dry etching process, a wet etching process, or an ion beam etching process, etc. In one embodiment, the sacrificial layer 206 is removed by an anisotropic dry etching process or an anisotropic wet etching process, etc. The anisotropic dry etching process or the anisotropic wet etching process may not be limited by etching directions, thus it may start etching from the sacrificial layer 206 exposed by the third openings in the second electrode layer 207, and extend into the first openings 204. Thus, the sacrificial layer 206 between the conductive sidewalls 205 and the second electrode layer 207 may be removed. Further, the sacrificial layer 206 between the second electrode layer 206 and the surface of the bottom of the first openings 204 may also be removed.

After removing the sacrificial layer, the suspended second electrode layer 207 may become a suspended three-dimensional (3-D) structure, which follows shapes of the first opening 204.

In one embodiment, the sacrificial layer 206 is made of poly silicon; an anisotropic dry etching process is used to remove the sacrificial layer 206. An etching gas of the anisotropic dry etching process may include one or more of $SF_6$, HBr, HCl, $C_2F_6$, and $CF_4$; a power may be in a range of approximately 100 W~500 W; and a temperature may be in range of approximately 40° C.~60° C.

Referring to FIGS. 8~9, before forming the second electrode layer 207, the sacrificial layer 206 in the peripheral region II may be removed; and the sacrificial layer 206 in the device region I may define position and size of the chamber 208. Further, the second electrode layer 207 may be formed on the surface of the second dielectric layer 203 in the peripheral region II, after removing the sacrificial layer 206, the portion of the second electrode layer 207 on the surface of the second dielectric layer 203 in the peripheral region II may support the second electrode layer 207 in the device region I to be suspended over the conductive sidewalls 205 and the bottoms of the first openings 204; and the chamber 208 may be formed. Thus, a size of the chamber 208 may be more precise; and it may aid to reduce the size of a pressure sensor.

In one embodiment, a projection of the first openings 204 on the surface of the second dielectric layer 203 may be concentric circles; and the second electrode layer 207 may have a plurality of trenches extending into the first openings 204, thus a projection of the trenches on the surface of the second dielectric layer 203 may coincide with the first openings 204. That is, the projection of the trenches on the surface of the second dielectric layer 203 may also be concentric circles. When a pressure is applied on the second electrode layer 207, the second electrode layer 207 having the concentric trenches may sense a uniform pressure, thus the life of a pressure sensor having the capacitive structure may be increased.

Further, when the second electrode layer senses the pressure, deformations of the second electrode layer 207 may gradually increase from the most outside circle of the concentric circles to the most inside circle of the concentric circles; thus, a deformation ability of the second electrode layer 207 may be increased. Therefore, when a pressure is applied on the second electrode layer 207, the capacitance change of a capacitive structure having the second electrode layer 207, the conductive sidewalls 205 and the chamber 208 may be larger, and the sensibility of a pressure sensor having the capacitive structure may be increased.

In certain other embodiments, a projection of the first openings 204 on the second dielectric layer 203 may be a plurality of the parallel strips. The second electrode layer 207 may have a plurality of the trenches extending into the first openings 204. Thus, a projection of the trenches on the second dielectric layer 203 may coincide with the first openings 204. That is, the projection of the trenches on the second dielectric layer 203 may also be a plurality of parallel strips. When the second electrode layer 207 senses an external pressure, the second electrode layer 207 may be deformed; and deformations of the second electrode layer 207 may gradually increase from both ends of the strips to the center of the strips.

Figure 10:
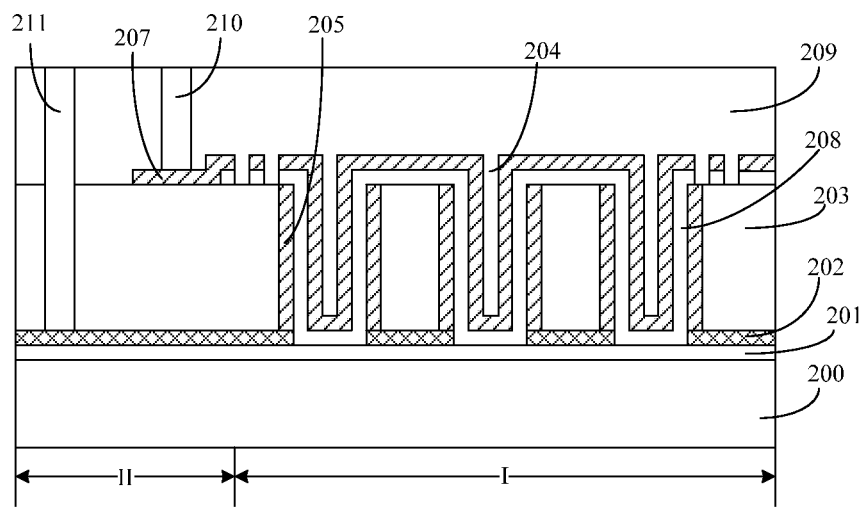

Returning to FIG. 14, after removing the sacrificial layer 206, a third dielectric layer may be formed on the surface of the second electrode layer 207 and the second dielectric layer 203 (S108). FIG. 10 illustrates a corresponding semiconductor structure.

As shown in FIG. 10, a third dielectric layer 209 is formed on the surface of the second electrode layer 207 and the surface of the second dielectric layer 203 in the peripheral region II. The third dielectric layer 209 may be utilized to seal the third openings in the second electrode layer 207. Thus, the chamber 208 may be closed to belong to a component of a capacitive structure. Further, the third dielectric layer 209 may also be utilized to protect the second electrode layer 207 in the peripheral region II from being damaged by subsequent processes.

The third dielectric layer 209 may be made of any appropriate material, such as silicon oxide, silicon nitride, silicon oxynitride, silicon carbonitride or low-K dielectric material, etc. A thickness of the third dielectric layer 208 may be in a range of approximately 4000 Å~5 μm.

Various processes may be used to form the third dielectric layer 209, such as a CVD process, a PVD process, an ALD process, or an FCVD process, etc. In one embodiment, the third dielectric layer 208 is formed by a CVD process. The CVD process may include a high-density plasma CVD (HDP CVD) process or a plasma enhanced CVD (PECVD) process, etc. A material formed by the PECVD process or a HDP CVD process may be deposited on sidewalls of the third openings firstly and close the third openings, thus the chamber 208 may be airtight. Further, the material formed by the PECVD process or the HDP CVD process may be unable to overfill the chamber 208, thus the chamber 208 may have a desired quality.

In one embodiment, the third dielectric layer 209 is made of silicon oxide; and the third dielectric layer 209 is formed by a PECVD process. A pressure of the PECVD process may be in a range of approximately 1 Torr~10 Torr. A temperature of the PECVD process may be in a range of approximately 360° C.~420° C. A power of the radio frequency plasma of the PECVD process may be in a range of approximately 400 W~2000 W. A flow of oxygen may be in a range of approximately 500 sccm~4000 sccm. A flow of ethyl silicate may be in a range of approximately 500 sccm~5000 sccm. A flow of helium may be in a range of approximately 1000 sccm~5000 sccm.

In certain other embodiments, a fourth dielectric layer (not shown) may be formed on the second electrode layer 207; and the third dielectric layer 209 may be formed on the fourth dielectric layer. The fourth dielectric layer may be made of a material different from the third dielectric material layer 209. The fourth dielectric layer may be used to protect the second electrode layer 207 when the third dielectric layer 209 in the device region I is subsequently etched. The fourth dielectric layer may be formed by a PECVD process, or a HDP CVD process, etc. The fourth dielectric layer may seal the third openings in the second electrode layer 206. Further, the fourth dielectric layer may prevent the third openings from being reopen when the third dielectric layer 209 in the device region I is etched.

Further, as shown in FIG. 10, after forming the third dielectric layer 209, a second conductive via 210 connecting with the second electrode layer 207 may be formed in the third dielectric layer 209 in the peripheral region II. In one embodiment, if the first electrode layer 202 is not connected with the semiconductor devices and/or the electrical interconnection structures in the substrate 200, a first conductive via 211 connecting with the first electrode layer 203 may also be formed in the third dielectric layer 209 and the second dielectric layer 203 in the peripheral region II. Electrical interconnection structures may be subsequently formed to electrically connect the second conductive via 210 and the first conductive via 211 with the semiconductor devices and/or electrical interconnection structures in the substrate 200 to form a MEMS capacitive pressure sensor.

The first conductive via 211 and the second conductive via 210 may be made of any appropriate material, such as Cu, Al or W, etc. A process for forming the first conductive via 211 and the second conductive via 210 may include forming through holes in the second dielectric layer 203 in the peripheral region II to expose first electrode layer 202 and the second electrode layer 207; and filling the through holes with metal material.

Figure 11:
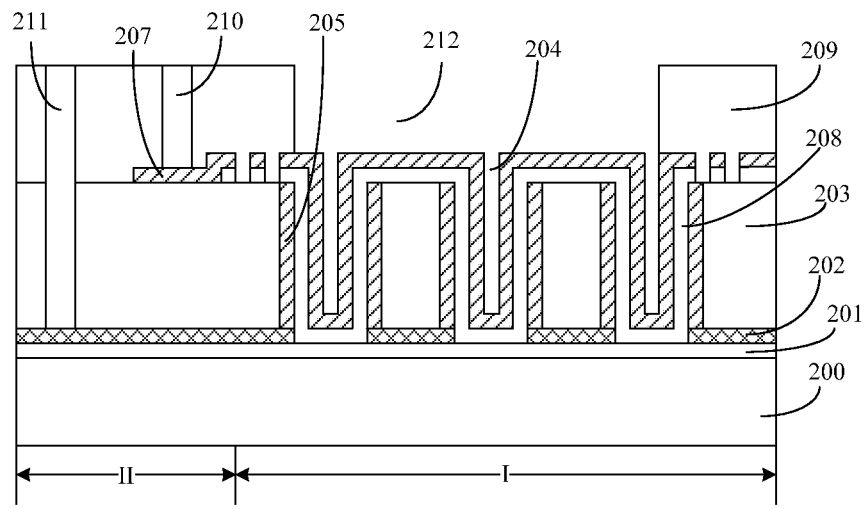

Returning to FIG. 14, after forming the first conductive via 211 and the second conductive via 211, a second opening may be formed in the third dielectric layer 209 (S109). FIG. 11 illustrates a corresponding semiconductor structure.

As shown in FIG. 11, a second opening 212 is formed in the third dielectric layer 209 in the device region I. The surface of the second electrode layer 207 in the device region I may be exposed by the second opening 212. The second opening 212 may enable the second electrode layer 207 in the device region Ito sense an external pressure directly, while the second electrode layer 207 in the peripheral region II may be protected by the third dielectric layer 209.

Various processes may be utilized to forming the second opening 212, such as a dry etching process, a wet etching process, or an ion beam etching process, etc. In one embodiment, the second opening 212 is formed by an anisotropic dry etching process. The second opening 212 may be formed by etching the third dielectric layer 209 in the device region I until the surface of the second electrode layer 207 is exposed.

In certain other embodiments, when the fourth dielectric layer (not shown) is formed on the second electrode layer 207, because the fourth dielectric layer may be made of a material different from the second dielectric layer 209; the fourth dielectric layer may be utilized as an etching stop layer, so that the surface of the second electrode layer 207 may be protected.

Thus, a MEMS capacitive pressure sensor may be formed by the above disclosed processes and methods, the corresponding MEMS capacitive pressure sensor is illustrated in FIG. 11. The MEMS capacitive pressure sensor includes a substrate 200 having a device region I and a peripheral region II. The MEMS capacitive pressure sensor also includes a first dielectric layer 201 on the substrate 200, and a first electrode layer 202 on the first dielectric layer 201. Further, the MEMS capacitive pressure sensor includes a second dielectric layer 203 having first openings 204, and conductive sidewalls 205 on sidewalls of the first openings 204 connecting with the first electrode layer 202. Further, the MEMS capacitive pressure sensor also includes a second electrode layer 207 with a portion on the second dielectric layer 203 and the rest suspended over the conductive sidewalls 205 in the device region I. Further, the MEMS capacitive pressure sensor also includes a chamber 208 between the conductive sidewalls 205 and the second electrode layer 207, and a third dielectric layer 209 with an opening 212 exposing the surface of the second electrode layer 206 in the device region I on the second electrode layer 206. Further, the MEMS capacitive sensor also includes a first conductive via 211 connecting with the first electrode layer 202 and a second conductive via connecting with the second electrode layer 207 in the third dielectric layer 209 in the peripheral region II. The detailed structures and intermediate structures are described above with respect to the fabrication processes.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A MEMS capacitive pressure sensor, comprising:
    a substrate having a first region and a second region;
    a first dielectric layer formed on one surface of the substrate;
    a first electrode layer formed on the first dielectric layer;
    a second dielectric layer formed on the first electrode layer and having a plurality of first openings;
    a plurality of conductive sidewalls connecting with the first electrode layer on sidewalls of the first openings;
    a second electrode layer with a portion formed on the second dielectric layer in the second region and the rest suspended over the conductive sidewalls in the first region, causing a chamber between the conductive sidewalls and the second electrode layer;
    a third dielectric layer on the second electrode layer exposing a portion of the second electrode layer in the device region; and
    a fourth dielectric layer utilized as an etching stop layer on the second electrode layer.

2. The MEMS capacitive pressure sensor according to claim 1, wherein:
    the first region is a device region; and
    the second region is a peripheral region.

3. The MEMS capacitive pressure sensor according to claim 1, wherein the chamber is formed by:
    forming a sacrificial layer on a surface of the second dielectric layer and surfaces of the conductive sidewalls;
    removing a portion of the sacrificial layer on the surface of the second dielectric layer in the peripheral region;
    forming a second electrode layer with a plurality of third opening exposing the sacrificial layer; and
    removing the sacrificial layer by an etching process through the third openings.

4. The MEMS capacitive pressure sensor according to claim 3, wherein:
    the semiconductor devices are CMOS devices.

5. The MEMS capacitive pressure sensor according to claim 1, further including:
    a first conductive via connecting with the first electrode layer and
    a second conductive via connecting with the second electrode layer in the third dielectric layer in the peripheral region.

6. The method according to claim 1, wherein the substrate further includes:
    a plurality of semiconductor devices and electrical interconnection structures inside and/or on one surface.

7. The MEMS capacitive pressure sensor according to claim 1, wherein:
    a projection of the first openings on the second dielectric layer is a plurality of concentric circles, a plurality of concentric squares, or a plurality of concentric polygons.

8. The MEMS capacitive pressure sensor according to claim 1, wherein:
    a projection of the first openings on the second dielectric layer is a plurality of parallel strips.

9. The MEMS capacitive pressure sensor according to claim 1, wherein:
    a number of the first openings is equal to, or greater than one.

10. The MEMS capacitive pressure sensor according to claim 1, wherein:
    the first electrode layer is made of one or more of TiN, Ti, TaN, Ta, W, TiC, TaC, La, Al and Cu; and
    the second electrode layer is made of one or more of TiN, Ti, TaN, Ta, W, TiC, TaC, La, Al, and Cu.

11. The MEMS capacitive pressure sensor according to claim 1, wherein:
    the first dielectric layer is made of $SiO_2$, SiN, SiON, SiCN or low dielectric constant material;
    the second dielectric layer is made of $SiO_2$, SiN, SiON, SiCN or low dielectric constant material; and
    the third dielectric layer is made of $SiO_2$, SiN, SiON, SiCN or low dielectric constant material.

* * * * *